United States Patent [19]
Gee et al.

[11] Patent Number: 5,619,396
[45] Date of Patent: Apr. 8, 1997

[54] MODULAR PCMCIA CARD

[75] Inventors: Homer T. Gee, Roseville; Daniel C. Steere, Jr.; Walter S. Matthews, both of Folsom, all of Calif.

[73] Assignee: Intel Corporation, Santa Clara, Calif.

[21] Appl. No.: 391,110

[22] Filed: Feb. 21, 1995

[51] Int. Cl.⁶ .................. H05K 7/20; G06F 1/20
[52] U.S. Cl. .................. 361/686; 361/737; 364/708.1
[58] Field of Search .................. 361/680–686, 361/737, 736, 748, 730, 735; 364/708.1; G06F 1/16

[56] References Cited

U.S. PATENT DOCUMENTS

| | | | |
|---|---|---|---|
| 5,373,149 | 12/1994 | Rasmussen | 235/492 |
| 5,416,730 | 5/1995 | Lookofsky | 364/708.1 |
| 5,451,933 | 9/1995 | Stricklin et al. | 361/737 |
| 5,463,261 | 10/1995 | Skarda et al. | 361/737 |
| 5,469,332 | 11/1995 | Alvité | 361/737 |
| 5,481,616 | 1/1996 | Freadman | 381/90 |
| 5,486,687 | 1/1996 | Le Roux | 235/382 |
| 5,521,369 | 5/1996 | Kumar | 235/472 |
| 5,522,089 | 5/1996 | Kikinis et al. | 395/893 |

*Primary Examiner*—Leo P. Picard
*Assistant Examiner*—Lynn D. Feild
*Attorney, Agent, or Firm*—Blakely, Sokoloff, Taylor & Zafman

[57] ABSTRACT

A modular PCMCIA card comprises a base member conforming to the Type I or Type II physical dimensions and an add on section which mechanically and electrically connects with the base member and has dimensions such that when the base member and the add on section are joined, they conform to the dimensions of a PCMCIA Type III card. The add on section may contain one or more functional units of a stand alone computer system and may also contain a battery, a modem, pager and/or an infrared transceiver for communicating with printers, computers or controlling other devices.

24 Claims, 4 Drawing Sheets

MODULAR PCMCIA CARD

Please refer to co-pending application Ser. No. 08/391,133 filed on Feb. 21, 1995 by Steere, et. al., entitled STAND ALONE PC CARD WITH I/O CAPABILITY and assigned to the same party as the present invention.

BACKGROUND OF THE INVENTION

1. Field of the Invention

The subject invention relates to PCMCIA cards. More particularly, it relates to a modular PCMCIA card comprising a base piece that conforms to the PCMCIA Type I or Type II physical dimensions and an interlocking second part that when added to the first piece conforms to the PCMCIA Type III dimensions.

2. Description of the Prior Art

The PCMCIA (Personal Computer Memory Card International Association) standard was developed for the purpose of providing user installed memory and I/O functions for small form factor digital computer systems. The standard specifies a card containing a printed circuit board. This product is usually referred to as a PC card. There are three PC card formats: Types I, II and III. All three have external dimensions of 54 millimeters by 85.6 millimeters. Thicknesses vary. Type I is 3.3 millimeters thick. Type II is 5 millimeters thick and Type III is 10.5 millimeters thick. The cards look similar to a conventional credit card. The standard specifies a 68 position connector on one end. The 68 position connector plugs into a mating connector mounted on a header which is in turn mounted to a mother board or daughter board which is located inside the host. The header is typically U shaped with the 68 pins at the base of the U. There is a wide variation of headers including headers for different thickness cards; however, the 68 pin connector is common to all PCMCIA cards.

The original PC cards were for memory addition and thus had no interaction with external devices. I/O cards were developed later to add functions such as modems, faxes, network interfaces, multi-media interface, sound cards, etc. In order to handle I/O functions, a second connector is located on the end of the card opposite the 68 pin connector. The I/O connector reaches the outside world through a cable.

Type I and Type II PCMCIA cards fit into the same PCMCIA slots. A Type III card would occupy two vertically stacked PCMCIA Type I/II slots. Most notebook size computers have one or two PCMCIA Type I/II slots. Most subnotebook and handheld computers have but one Type I/II slot. Very few computers of any size have Type III slots yet. However, there is a strong need for the functionality that only the larger volume of a Type III card can provide such as to accommodate a harddisk drive. There is expected to be a strong trend to computers with Type III slots in the coming years, but there is currently a large installed base of computers with Type I/II slots only, and this installed base will grow substantially. Thus there is a need for a modular PCMCIA card that can perform certain functionality as a Type I or II card for those computers that only have a Type I/II slot and at the same time provide Type III card functionality for computers that have a Type III slot.

In addition, as pointed out in the co-pending patent application referenced in the first section of this application, there is a need for a stand alone computer that fits the PCMCIA format. This computer acts as a companion to a desktop or other larger computer. When in the larger computer, the PCMCIA card acts as additional memory. When out of the larger computer, the PCMCIA card is a stand alone computer. Because this is very difficult to accomplish with a Type I or Type II card, it is desirable to have a way to get added volume for the additional components without sacrificing PCMCIA card, Type I or II compatibility.

SUMMARY

The present invention provides a modular PCMCIA card which includes a base member conforming to the Type I or Type II physical dimensions and an add on section adapted to mechanically and electrically connect with the base member and having dimensions such that when the base member and the add on section are joined, they conform to the dimensions of a PCMCIA Type III card. The add on section may contain one or more functional units of a stand alone computer system and may contain a modem, pager and/or an infrared transceiver.

BRIEF DESCRIPTION OF THE DRAWING

The preferred embodiments of the invention will now be described in conjunction with the Drawing, wherein.

DETAILED DESCRIPTION OF THE PREFERRED EMBODIMENT

According to one aspect of the present invention a modular Type III PCMCIA card consists of a base member that conforms to the PCMCIA Type I or Type II physical dimensions and an interlocking add on part that when attached to the base member conforms to the PCMCIA Type III dimensions.

Figure 1:
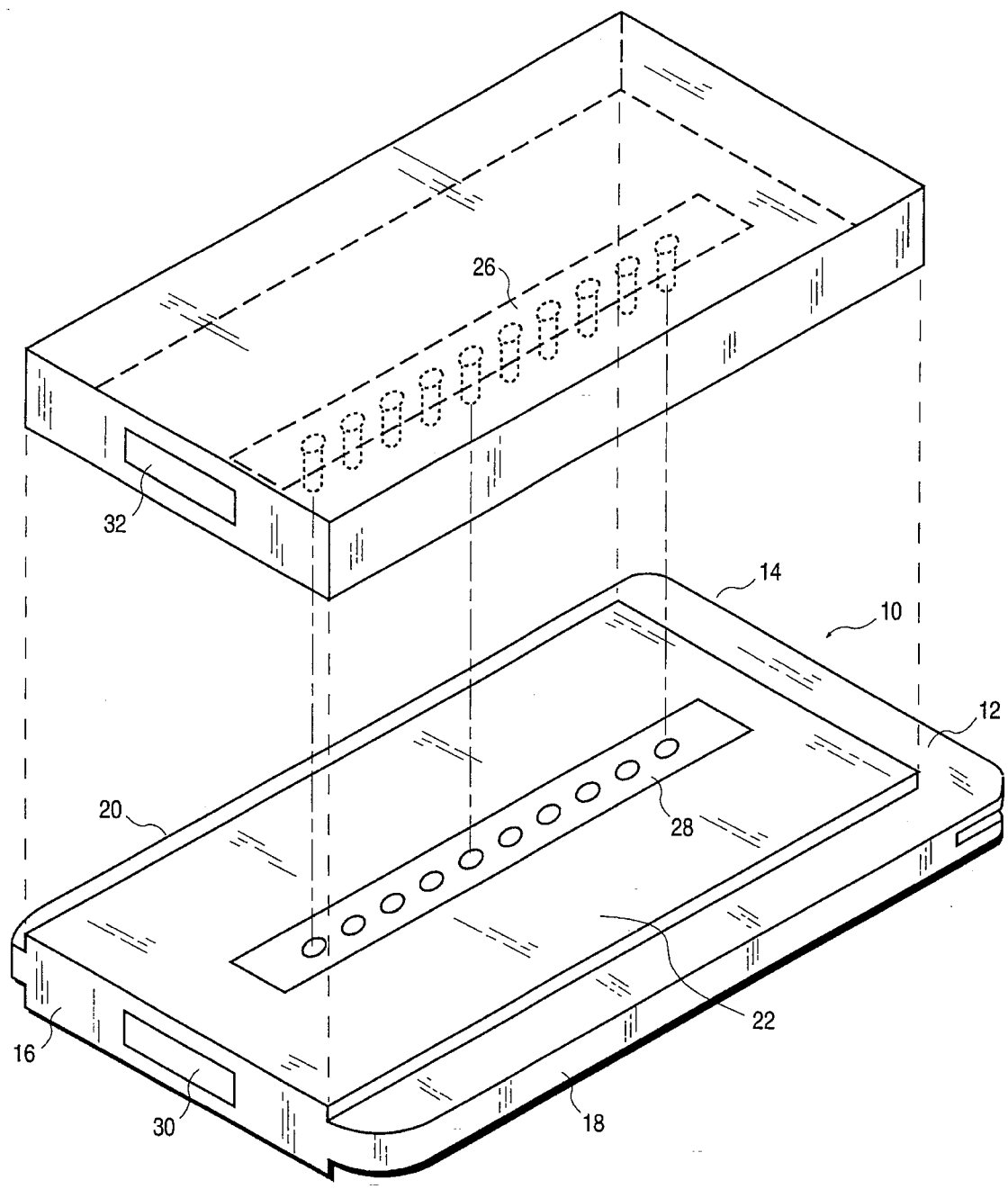
FIG. 1 is a perspective drawing of the modular PCMCIA card according to the present invention.

FIG. 1 is a perspective drawing of the modular PCMCIA card according to the present invention. Referring now to FIG. 1, a base member 10 is a Type II PCMCIA card and consists of an edge area 12 that is 3.3 mm thick. Base member 10 has a rectangular top view with a short sides 14 and 16 and long sides 18 and 20. Over a center area 22 of base member 10, the thickness increases to 5.0 mm. An interlocking add on section 24 corresponds in length and width to center area 22. Add on section 24 is 5.5 mm thick. Add on section 24 connects mechanically to base member 10 by means of a connector consisting of a plurality of pins 26 located in add on section 24 and a plurality of mating sockets 28 in center area 22 of base member 10.

Base member 10 has a PCMCIA 68 pin connector located in the edge of short side 14 (not shown) and an I/O connector 30 located in the edge of short side 16.

Electrical connection between add on section 24 and base member 10 may in the preferred embodiment be done with the same pins 26 and socket 28 as is used for mechanical connection. Or, alternatively, a small cable or clip (not shown) may be used to connect I/O connector 30 of base member 10 to a corresponding connector 32 in add on section 24.

In operation, the combination of PCMCIA base member 10 with add on section 24 attached will be plugged into a Type III slot if one is available. Otherwise, modular add on section 24 may be detached and PCMCIA base member 10 may be inserted into the more common Type I/II slot.

The modularity allows a Type I or Type II PCMCIA card to house additional capabilities such as a removable or additional battery, memory, a modem or a pager unit.

According to another aspect of the invention, add on section 24 when attached to base member 10 need not conform to the PCMCIA Type III specification since it will not be inserted into a Type III slot. Rather it will provide the peripheral features of a stand alone computer as described in the copending application referenced in the first section of this application. These peripheral features include, a keyboard such as a qwerty keyboard, a display such as a touch screen display, an LCD display, flash or SRAM a microprocessor and/or extra battery power. Alternatively, voice recognition capability could be provided. This would include a microphone, a speaker and a digital signal processor and voice recognition software. Yet another capability that could be included is an infrared transceiver for communicating remotely to a printer, another computer or for controlling other devices.

In operation PCMCIA base member 10 performs in two separate modes. When the base member 10 is not plugged into a PCMCIA slot in a host computer, add on section 24 is connected to it and together they are a stand alone computer. This means that it has a CPU, memory, an input device, an output device, its own power and a software operating system. In stand alone mode, the computer may be used to access and update various data bases such as phone directories, appointment calendars, etc. In the second mode, add on section 24 is removed and base member 10 is inserted into a PCMCIA Type I/II slot in a host computer. In this mode, power is supplied by the host. In use, data bases such a phone directory, or an appointment calendar that are routinely kept on the host are down loaded into a flash memory in base member 10. Any changes to these data bases entered when base member 10 was used as a stand alone computer are up loaded by the host into the host's data base. Thus, when base member 10 is plugged into the host, the data in both are mutually updated so that they are the same.

Figure 2:
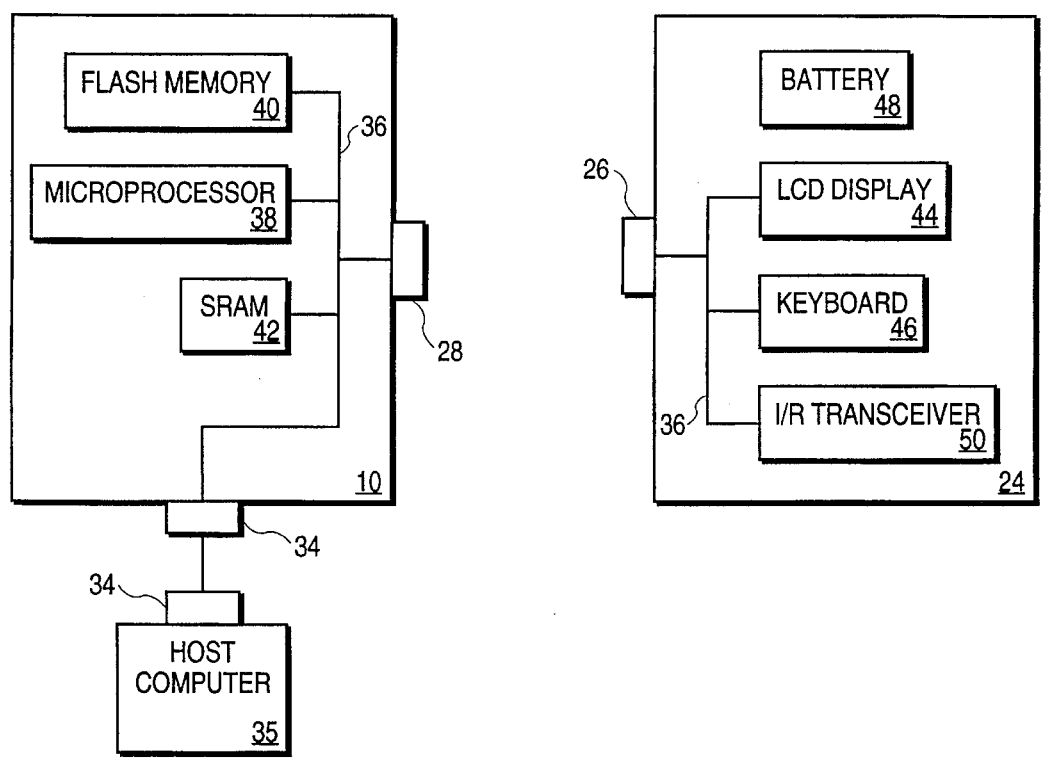
FIG. 2 is a block diagram of one system configuration of the present invention.

FIG. 2 is a block diagram of one system configuration of the present invention. Referring now to FIG. 2, base unit 10 has a PCMCIA connector 34 which connects bus 36 to a host computer 35. Within base unit 10, microprocessor 38, flash memory module 40, and a static random access memory ("SRAM") module 42 are connected to bus 36. Bus 36 is also connected to the socket section 28 of a second PCMCIA connector. Add in section 24 also contains bus 36 which is connected to the pins section 26 of the second PCMCIA connector. When pin section 26 and socket section 28 are connected, bus 36 extends into add in section 24. Within add in section 24, a LCD display 44 is connected to bus 36. Qwerty keyboard 46 is also connected to bus 36. Battery 48 provides power to run all of the components on both base member 30 and add in section 24. Finally, an infrared ("I/R") transceiver 50 is connected to bus 36.

Figure 3:
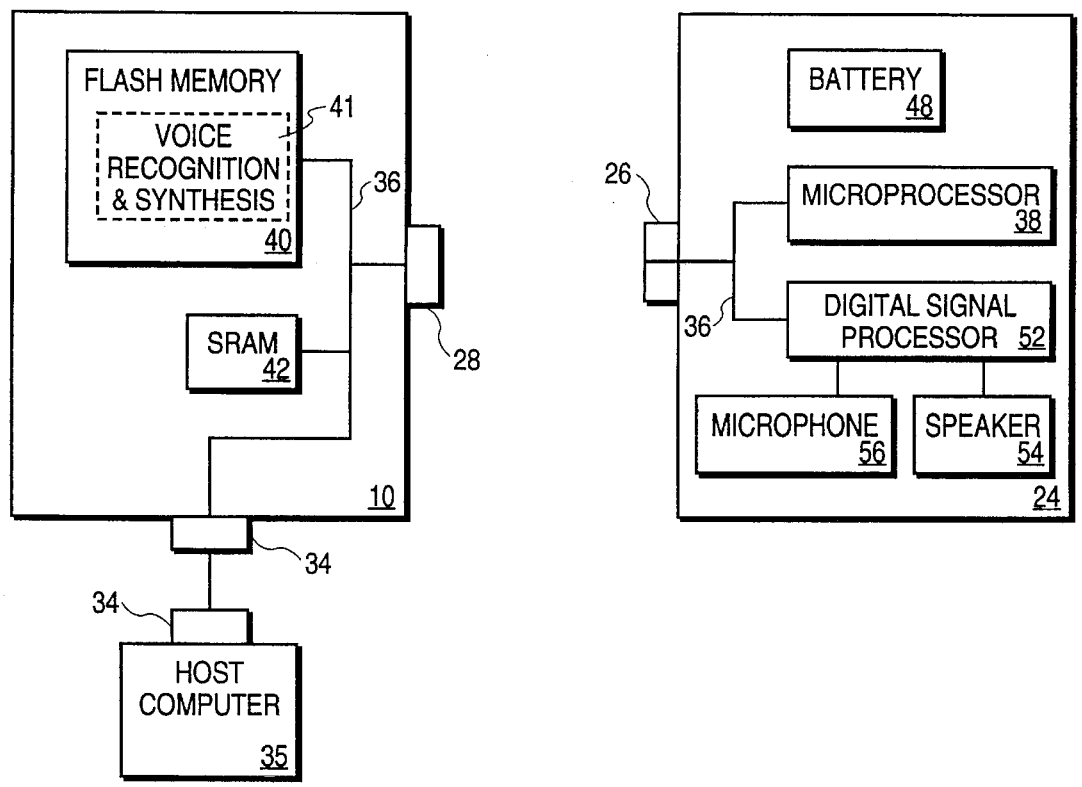
FIG. 3 is a block diagram of a second system configuration of the present invention.

FIG. 3 is a block diagram of another system configuration of the present invention. In the configuration of FIG. 3, base unit 10 contains flash memory module 40 and SRAM module 42, both of which are connected to bus 36. Flash memory module 40 contains voice recognition and synthesis software 41. Within add in section 24, microprocessor 38 and a digital signal processor 52 are connected to bus 36.

Speaker 54 and microphone 56 are in turn connected to digital signal processor 52. Again, battery 48 provides power to run all of the components on both base member 10 and add in section 24.

Figure 4:
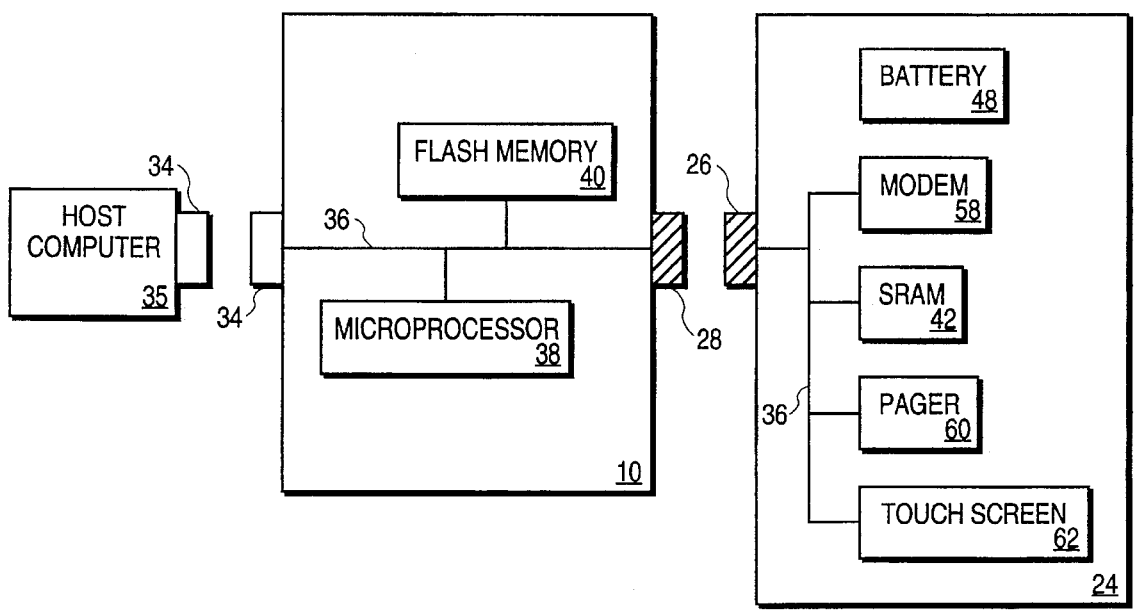
FIG. 4 is a block diagram of a third system configuration of the present invention.

FIG. 4 is a block diagram of yet another system configuration of the present invention. In the configuration of FIG. 4, base unit 10 contains a microprocessor 38 and flash memory module 40 both of which are connected to bus 36. add in section 24 contains a SRAM module 42, a modem 58, pager circuitry 60 and a touch screen display 62 all are connected to bus 36. As in the pervious embodiments, battery 48 provides power to run all of the components on both base member 10 and add in section 24.

The foregoing preferred embodiments are subject to numerous adaptations and modifications without departing from the concept of the invention. Therefore, within the scope of the appended claims, the invention may be practiced other than as specifically described herein.

What is claimed is:

1. A companion computer for a host computer where said host computer is adapted to receive and communicate electrically with PC cards no larger than a predetermined length, width and thickness, said companion computer comprising:

a base member having a thickness no larger than said predetermined thickness, having a first connector for communication with said host and containing flash memory and a microprocessor;

an add on section adapted to mate mechanically and electrically with said base section and in combination with said base member having a thickness greater than said predetermined thickness, said add on section including a battery and one or more peripheral components that when connected to said flash memory and microprocessor form a stand alone computer.

2. The system of claim 1 wherein said one or more peripheral components includes a LCD display.

3. The system of claim 1 wherein said one or more peripheral components includes a qwerty keyboard.

4. The system of claim 1 wherein said one or more peripheral components includes a touch screen.

5. The system of claim 1 wherein said add on section contains a battery.

6. The system of claim 1 wherein said one or more peripheral components includes a modem.

7. The system of claim 1 wherein said add on section contains a pager unit.

8. The system of claim 1 wherein said one or more peripheral components includes an infrared transceiver.

9. A companion computer for a host computer where said host computer is adapted to receive PC cards substantially rectangular in top view and having a thickness no larger than a predetermined first thickness and including a connector for electrically communication with said PC cards, said companion computer comprising:

a base member having two long sides and two short sides that form a substantially rectangular PC card, the area within said short sides and said long sides being divided into an edge area and a center area, said center area including a mechanical and electrical connector, said base member having a thickness no larger than said first predetermined thickness, said base member further having a first connector for communication with said host and containing at least flash memory;

an add on section having length and width dimensions substantially the same as said center area and containing a mechanical and electrical connector adapted to mate mechanically and electrically with said connector on said center area of said base section and in combination with said base member having a thickness greater than a second predetermined thickness, said add on section including a battery, a microprocessor and one or more peripheral components that when connected to said flash memory and microprocessor form a stand alone computer.

10. The system of claim 9 wherein said one or more peripheral components includes a LCD display.

11. The system of claim 9 wherein said one or more peripheral components includes a qwerty keyboard.

12. The system of claim 9 wherein said one or more peripheral components includes a touch screen.

13. The system of claim 9 wherein said add on section contains a battery.

14. The system of claim 9 wherein said one or more peripheral components includes a modem.

15. The system of claim 9 wherein said add on section contains a pager unit.

16. The system of claim 9 wherein said one or more peripheral components includes an infrared transceiver.

17. A companion computer for a host computer where said host computer is adapted to receive PC cards substantially rectangular in top view and having a thickness no larger than 5 millimeters and including a connector for electrically communication with said PC cards, said companion computer comprising:

a base member having two long sides substantially 85.6 millimeters in length and two short sides substantially 54 millimeters in length that form a substantially rectangular PC card, the area within said short sides and said long sides being divided into an edge area of substantially 3.3 millimeters thickness and a center area of substantially 5 millimeters thickness, said center area including a mechanical and electrical connector, said base member having a thickness no larger than 5 millimeters, said base member further having a first connector for communication with said host and containing flash memory and a microprocessor;

an add on section having length and width dimensions substantially the same as said center area and containing a mechanical and electrical connector adapted to mate mechanically and electrically with said connector on said center area of said base section and in combination with said base member having a thickness greater than 10.5 millimeters, said add on section including a battery and one or more peripheral components that when connected to said flash memory and microprocessor form a stand alone computer.

18. The system of claim 17 wherein said one or more peripheral components includes a LCD display.

19. The system of claim 17 wherein said one or more peripheral components includes a qwerty keyboard.

20. The system of claim 17 wherein said one or more peripheral components includes a touch screen.

21. The system of claim 17 wherein said add on section contains a battery.

22. The system of claim 17 wherein said one or more peripheral components includes a modem.

23. The system of claim 17 wherein said add on section contains a pager unit.

24. The system of claim 17 wherein said one or more peripheral components includes an infrared transceiver.

* * * * *